April 21, 1970 TAKEO SUZUKI 3,508,177
TRANSMISSION LINE UHF TUNING CIRCUIT CAPABLE OF OPERATING WITHIN TWO FREQUENCY BANDS
Filed Sept. 4, 1968
FIG. 1A
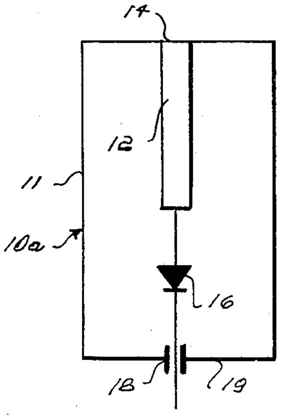
PRIOR ART
FIG. 1B
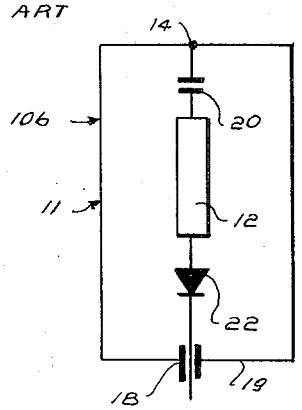
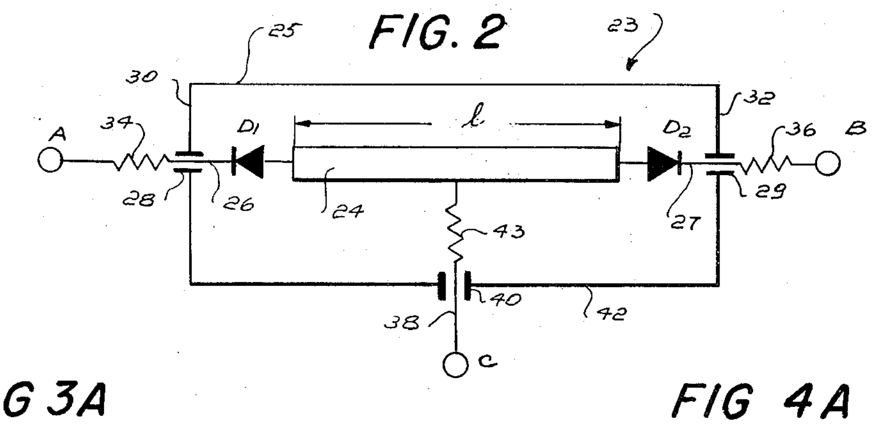
FIG. 2
FIG 3A
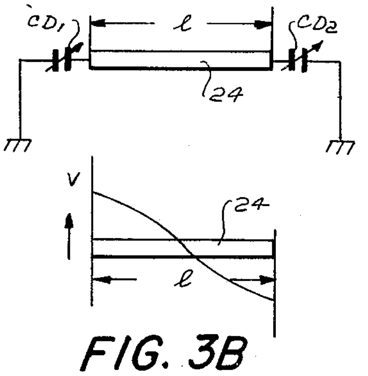
FIG. 3B
FIG 4A
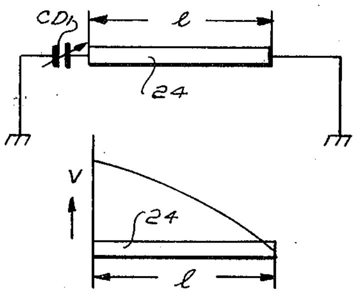
FIG. 4B
INVENTOR
TAKEO SUZUKI
BY James and Franklin
ATTORNEY United States Patent Office 3,508,177
Patented Apr. 21, 1970

3,508,177
TRANSMISSION LINE UHF TUNING CIRCUIT CAPABLE OF OPERATING WITHIN TWO FREQUENCY BANDS

Takeo Suzuki, Tokyo, Japan, assignor to Alps Electric Company, Limited, Tokyo, Japan, a corporation of Japan Filed Sept. 4, 1968, Ser. No. 757,395
Claims priority, application Japan, Sept. 19, 1967, 42/59,605, 42/59,606
Int. Cl. H03j 3/18, 5/00
U.S. Cl. 334—15 10 Claims

ABSTRACT OF THE DISCLOSURE

A resonant UHF tuning circuit capable of operating in two frequency bands comprises a transmission line arranged within a resonant cavity with first and second capacitive devices operatively connected to each end of that line, one of the capacitive devices being selectively enabled and disabled, thereby to selectively operate the circuit in one or the other of the frequency bands.

The present invention relates to tuning circuits and particularly to a resonant cavity tuning circuit capable of being selectively operable in two discrete frequency ranges.

The increased utilization of the ultra-high frequency (UHF) band for commercial television and other communication purposes has required the development of sophisticated high frequency tuning circuitry. One known high frequency tuning circuit makes use of the tuning characteristics of a resonant cavity—a space enclosed by conducting walls which has a resonant frequency defined by the mode of electrical field which can be sustained in that space. The resonant frequency of the cavity per se is thus determined by its dimensions and configuration.

By coaxially arranging a transmission line such as a fixed inductance line within the cavity and by adding variable reactance means such as capacitive means to that line, controlled variations may be made in the resonant frequency of the cavity. It has thus been proposed to place a fixed inductance line within the interior of the cavity and to operatively connect a fixed or variable capacitor to that line, the variable capacitor being selectively adjusted to vary the resonant frequency of the cavity tuner.

Depending on the circuit arrangement of the capacitor element relative to the inductance line within the cavity, the latter may operate in a variety of modes, the most common of these being the $\lambda/2$ mode and the $\lambda/4$ mode. In the $\lambda/2$ mode it may be considered that a standing half wave is formed on a line of given length, whereas in the $\lambda/4$ mode a standing quarter wave is thus formed. Since wave length is inversely related to frequency, a given length of line operating in the $\lambda/2$ mode resonates at twice the frequency of the same line operating in the $\lambda/4$ mode. The signal wave length which the cavity can sustain, and thus the resonant frequency of the cavity, is therefore determined by the mode of operation of the cavity—the circuit arrangement of the inductance line and the capacitors within the cavity determine the mode of operation of the cavity and hence the order of magnitude of its resonant frequency.

Variable capacitance diodes have the characteristic that when they are reverse biased, they act as capacitors, and when they are forward biased, they act substantially as a short circuit. Thus, the diodes can be selectively enabled or disabled as capacitors by simply varying the sense of the bias applied thereto. It has been proposed in the past to connect a variable capacitance diode to one end of the transmission line in the resonant cavity and to vary the magnitude (but not the sense) of the bias applied to that diode, so as to selectively vary the effective length of the transmission line and thus to vary the resonant frequency thereof. In these known arrangements the tuning cavity will continue to operate in the same mode for all capacitive values of the diode. Selectively enabled and disabled variable capacitance diodes have also been connected between a wall of the cavity and a carefully chosen intermediate point along the length of the line. Selective enabling of such diodes has only the effect of varying the effective tuning length of the transmission line while it continues to operate in the same mode as before, the ratio of the effective line lengths and thus the tunable frequency bands of the cavity, for the enabled and disabled condition of the selectively enabled capacitive diode, being determined by the positioning of that diode along the length of the transmission line. Thus, the positioning of the selectively enabled diode with respect to the transmission line must be done with great precision to insure accurate frequency selection in both operative frequency ranges of the cavity tuner, since the resonant frequency is proportional to the effective tuning length of the transmission line. Moreover, in the actual construction of physically embodied cavity tuners of this type, the length of that line may be varied to an undesirable extent by lack of precision in soldering the diode terminals to the line, thereby to produce an additional source of possible error in the tuning capabilities of the cavity tuner.

As a conventional UHF receiver generally requires at least three separate tuning stages, it is desirable for the various tuning stages to accurately match or track one another so that each of the stages will be tuned to substantially the same frequency. In the previous constructions of resonant cavities of this type, it was difficult to achieve the desired accuracy of tracking of the several tuning stages—tuning over the desired frequency ranges required the operation of the variable capacitor diodes over a wide bias range, including quite low bias levels, and at those low bias levels the voltage-capacitance relationships of these diodes are erratic and non-uniform, and hence militating against accurate tracking. Moreover, at these low bias levels, the capacitance values of the reverse biased diodes may be more readily varied as a result of the high-frequency signals encountered in UHF operation, thus introducing yet an additional source of tuning and tracking error to the tuner.

It is a prime object of the present invention to provide a resonant cavity tuner in which the disadvantages of the prior art tuners of this type are substantially reduced or eliminated.

It is another object of the present invention to provide a resonant cavity tuner capable of operating at UHF frequencies in which the effective band of tunable frequencies is increased.

It is a further object of this invention to provide a resonant cavity tuner which can be readily and selectively operated within two different frequency bands.

It is still a further object of the present invention to provide a resonant cavity tuner in which greater precision of frequency selection is obtained over the entire operative frequency range in either of two separated frequency bands.

It is yet another object of the present invention to provide a tuning circuit which can be employed in several tuning stages of a high frequency communication receiver or the like, in which precise tracking of the tuning stages is effective over the entire frequency range of interest.

It is still an additional object of the present invention to provide a tuner in which the need for precision in fabrication is minimized, so that the tuner may be readily and economically fabricated by relatively low skilled personnel.

It is yet another object of the present invention to provide a UHF tuning circuit in which at least one variable capacitance diode is utilized as a tuning element, and in which a broad range of frequency tuning is achieved while operating the diode at biasing levels at which it operates in a substantially linear and uniform manner, thereby to minimize distortion.

It is another object of the present invention to provide a tuning circuit in which a transmission line is arranged in a resonant cavity and in which the mode of operation of the cavity may be selectively varied from a $\lambda/4$ mode to a $\lambda/2$ mode, thereby to select the frequency range at which the tuner is operative.

It is still a further object of this invention to provide a tuning circuit capable of selectively operating within two frequency bands in which band selection is effected without the need for complex and costly mechanical switching elements.

To these ends, the present invention provides a resonant circuit capable of operating within first and second frequency bands in which a transmission line is arranged within a resonant cavity, first and second capacitive means being respectively operatively connected to each end of that line. Means are provided to selectively enable and disable one of these capacitive means, thereby to provide selective operation of the tuning circuit in one or the other of its operative frequency bands.

To permit tuning of the resonant circuit within the selected frequency band, at least one of the capacitive means is variable, thereby to effectively vary the resonant frequency of the circuit. In a particular form of the present invention as herein specifically disclosed, that capacitive means is in the form of a variable capacitance diode which has the characteristic of acting as a capacitor when it is reverse biased and as a short circuit or conductor when it is forward biased. The means for selectively enabling and disabling the capacitive diode thus comprises means effective to apply either a reverse or forward bias to that diode.

The arrangement of the selectively enabled capacitance with respect to the transmission line and the walls of the resonant cavity permits the transmission line to operate as a tuning element in two distinct operating modes depending on the condition of that capacitance. Thus, in one condition of that capacitance the transmission line acts as a $\lambda/2$ resonator having a given line length, and when in its other operative condition, the line acts as a $\lambda/4$ resonator at that same line length. The tuning circuit is thus tunable to frequencies within two distinct frequency bands depending on the operative mode of the transmission line—the variation in the operative mode of the transmission line from the $\lambda/2$ to the $\lambda/4$ mode varies the resonant frequency by a factor of one-half.

To the accomplishment of the above and to such other objects as may hereinafter appear, the present invention relates to a resonant circuit as defined in the appended claims and as described in this specification, taken together with the accompanying drawing, in which:

FIGS. 1A and 1B illustrate two typical prior art cavity resonators, FIG. 1A illustrating a resonator having a $\lambda/4$ mode of operation, and FIG. 1B illustrating a resonator having a $\lambda/2$ mode of operation;

FIG. 2 is a schematic diagram of the tuning circuit of the present invention;

FIG. 3A is an equivalent circuit diagram of the circuit of FIG. 2 illustrating the operation of that circuit in its high frequency or $\lambda/2$ mode of operation;

FIG. 3B is a voltage distribution curve along the transmission line of FIG. 3A;

FIG. 4A is an equivalent schematic circuit diagram of the circuit of FIG. 2 illustrating the operation of that circuit in its low frequency or $\lambda/4$ mode; and FIG. 4B is a voltage distribution voltage curve along the transmission line of FIG. 4A.

Broadly described, the present invention may be considered as a tuning circuit in which a fixed length transmission line is arranged within a resonant cavity and which is capable of operating in either of two wave-length supporting modes depending on the selective enabling or disabling of a capacitive device operatively connected to one end of the transmission line. The selection of the operative mode of the transmission line determines the resonant frequency of that circuit.

FIGS. 1A and 1B illustrate prior art embodiments of cavity resonators each being capable of operating in only a single mode. The cavity resonator **10*a* of FIG. 1A, which operates in a $\lambda/4$ mode, comprises a resonant cavity 11 in which is arranged a transmission line in the form of a fixed inductance line 12. One terminal of the inductance line 12 is directly connected to the conductive end wall 14 of cavity 11 and the other end of line 12 is connected to one terminal of a capacitive element in the form of a variable capacitance diode 16, that diode being operative as a capacitor when a reverse bias is applied thereto. The other terminal of diode 16 passes through a feedthrough capacitor 18 provided in the opposite end wall 19 of cavity 11 to a source of bias potential. A voltage node will be created along line 12 at end wall 14 and a voltage anti-node or peak will be developed at the other end of that line, thus creating a quarter wave length standing wave along line 12. In the cavity resonator 10*b*, illustrated in FIG. 1B, each end of line 12 is operatively connected to the conducting walls of cavity 11 through a capacitor, one end of line 12 being so connected to the end wall 14 by capacitor 20, the other being operatively connected to the opposing end wall 19 through a variable capacitance diode 22 having a lead from its cathode terminal passing through wall 19 of cavity 11 through a feedthrough capacitor 18. In the cavity resonator of FIG. 1B, a voltage node is developed at the mid-point of line 12 and voltage peaks are developed at each end of that line, so that resonator 10*b*** thus operates in a $\lambda/2$ mode in which a half wave length of the sustained signal is developed.

In the resonant cavity tuning circuit 23 of this invention as shown in FIG. 2, means are provided to selectively operate that tuning circuit in either of the modes described with reference to the prior art embodiments of FIGS. 1A and 1B. To this effect a transmission line in the form of a fixed inductance line 24 having an effective line length $l$ is arranged within the interior of a resonant cavity 25. Capacitive means in the form of a pair of variable capacitance diodes D1 and D2 are respectively connected to each end of line 24.

Variable capacitance diodes D1 and D2 have the characteristic that they are enabled to be operative as equivalent capacitors when reverse biased, or disabled to operate as no-loss conductors or short circuits when forward biased. By selectively enabling and/or disabling either one of diodes D1 and D2, the tuning circuit of FIG. 2 can be made equivalent in its mode of operation to either of the prior art cavity resonators **10*a* and 10*b* illustrated in FIGS. 1A and 1B. To this end, leads 26 and 27 connected to the cathodes of diodes D1 and D2 respectively are passed through feedthrough capacitors 28 and 29 respectively arranged in the opposing end walls 30 and 32 of cavity 25. These leads are coupled respectively to potential ports A and B through resistors 34 and 36 respectively, these resistors being located external to the cavity 25. The potential signal at a common voltage port C is conducted on a lead 38 through a feedthrough capacitor 40 provided in the longitudinal wall 42 of cavity 25 to one terminal of a current limiting resistor 43 the other terminal of which is operatively connected to the midpoint of inductance line 24. Selected biasing potential is thus applied to diodes D1 and D2 by applying suitable potentials at ports A, B, and C. The bias across diode D1** is thus the difference in potential between ports A and C, and the bias across diode D2 is the potential difference between ports B and C.

High frequency operation of the tuning circuit 23 of FIG. 2, is illustrated in FIGS. 3A and 3B, which illustrate the operation of the tuning circuit in its λ/2 mode. Diodes D1 and D2 are both enabled by the application of reverse bias thereto by applying positive potentials at ports A and B and returning port C to ground or 0 volts, to produce the equivalent circuit of FIG. 3A, in which the capacitances of the enabled diodes are represented by variable capacitors CD1 and CD2. This may be done, in one exemplary embodiment, by applying positive voltage of 5–30 volts to terminals A and B and zero or ground voltage to terminal C. One terminal of each of these capacitors is respectively, operatively connected to each end of inductance line 24, the other terminal of the capacitors being returned to ground. The voltage distribution curve along the length of line 24 for the circuit of FIG. 3A is illustrated in FIG. 3B in which the electromagnetic potential is represented along the vertical axis, the length *l* of line 24 being represented along the horizontal axis. From FIG. 3B is seen that a voltage antinode is produced at each end of the line 24 thus defining a half-wave length standing wave across the length *l* of that line. Tuning circuit 23 can thus be described as operating in a λ/2 dominant mode, in which the standing wave length of a complete cycle is twice the effective length *l* of line 24. Tuning circuit 23 will thus be effective to resonate at a frequency corresponding to that standing wave length. That resonant frequency will be determined by the physical length of line 24 as modified by the values of the capacitors CD1 and CD2 which are varied in accordance with the level of the reverse bias voltage applied thereto, thereby to tune within the frequency band determined by the mode of resonant operation.

Low frequency operation of tuning circuit 23, in which the cavity 25 is operated in the λ/4 mode, is illustrated in FIGS. 4A and 4B. Diode D1 is reverse biased and a forward bias is applied across diode D2 by applying suitable potentials at ports A, B, and C to cause diode D1 to act as a capacitor and diode D2 to act as a short circuit, thereby to operatively directly connect one end of line 24 to one wall of cavity 25, to create the equivalent circuit of FIG. 4A. This may be done in one exemplary embodiment, by applying positive voltage of 15–40 volts to terminal A, positive voltage of 10 volts to terminal C, and zero or ground voltage to terminal B. As seen in the voltage distribution curve of FIG. 4B for that equivalent circuit, a voltage peak is developed at the end of line 24 to which capacitance CD1 of diode D1 is operatively connected, and a voltage node is developed at the other end of line 24 which is operatively directly connected to the wall of cavity 25 through the conduction path of the forward biased diode D2. Thus, a quarter wave length will be established and sustained along the length of line 24, and tuning circuit 23 will resonate at frequencies having wave lengths equal to four times the effective line length of line 24.

The voltage distribution curve of FIG. 4B illustrating the λ/4 mode operating mode of cavity 25, in which a node is created at the end of line 24, may also be considered as illustrating a λ/2 mode of operation for a line having an equivalent effective length of *l*/2. The high frequency operation of the tuning circuit 23 is thus equivalent to its low frequency or λ/4 mode with an effective halving of the effective length *l* of inductance line 24. Tuning variation will be effected by varying the level of the reverse bias applied to diode D1 (in the specified example, from +15 to +40 volts) to vary the capacitance value of that reverse biased diode.

Thus, the present invention provides a resonant cavity tuning circuit which is capable of selectively operating within either of two distinct operative modes, the circuit thus being tunable over a range of frequencies within two distinct frequency bands determined by the voltage distribution pattern sustained in the cavity in each of these modes. Selection of particular frequencies in each of these ranges is effected by varying the bias potential applied to the reverse-biased (capacitively acting) diode or diodes.

Thus, a single resonant cavity may be utilized to operate at two distinct frequency bands to increase the effectively usable tuning range of that cavity. This increased frequency range is achieved by selectively enabling one or both of a pair of variable capacitance diodes by applying suitable bias at that reversed level to that diode. The thus enable ddiodes may be biased to relatively high levels in which their capacitance and voltage relationship is substantially linear and free from distortion, so that the tuning response of circuit 23 is accurately responsive to the tuning bias potential applied to the tuning diodes. If a plurality of such tuning circuits are employed in the various stages of an RF end of a television receiver or the like, the tracking of these stages can be accurately controlled by a single tuning control, as the tuning diodes in each of the tuning stages are operated in their linear operating regions. The capability of switching circuit 23 from its low to high frequency mode of operation, makes possible the use of the tuning diodes in only their relatively narrow, linear regions, while still achieving a sufficiently broad overall frequency tuning range. The tuning circuit of the present invention uses the same line length for both low and high frequency operation simply by varying the operating mode of that line from the λ/4 to the λ/2 mode. A longer physical line length can thus be used for both frequency ranges, so that the tuning circuit may be more readily fabricated with greater permissible dimensional tolerances. Further ease of fabrication is achieved in this invention by making the operative connection of the variable capacitance diodes to each end of the line rather than to an intermediate point of the latter, so that the precision of this connection is less critical than in prior art constructions. Furthermore, since the variable capacitance diodes are biased in their linear operating regions, they are less susceptible to undesired changes in their capacitance levels due to the high frequency signals in the cavity, further increasing the tuning and tracking accuracy of the tuning stage or stages comprising the tuning circuit of this invention.

The switching from one frequency range to the other and frequency selection within that range is readily achieved without the need for mechanical switching devices, so that the cost and complexity of the UHF tuning stages are effectively reduced, without reducing the accuracy or reliability of tuner operation.

While only a single embodiment of this invention has been specifically herein disclosed, it will be apparent that variations may be made thereto without departing from the spirit and scope of the invention.

I claim:

1. A resonant circuit for operation within first and second frequency bands comprising a resonant cavity, a transmission line arranged within said cavity, first variable capacitive means operatively connected to one end of said line, second capacitive means operatively connected to the other end of said line, means effective to selectively operatively enable and disable said second capacitive means, thereby to selectively operate said circuit in one or the other of said frequency bands, and means effective to vary said first capacitive means, thereby to tune said circuit to a desired frequency within said selected one or the other of said frequency bands.

2. The circuit of claim 1, in which said second capacitive means when operatively enabled comprises variable capacitive means.

3. The circuit of claim 2, in which said transmission line has a line length of *l*, said circuit operating in said first frequency band as a λ/2 resonant circuit with a line length of *l* when said one of said capacitive means is enabled, and in said second frequency band as a $\lambda/4$ resonant circuit with a line length of $l$ when said one of said capacitive means is disabled.

4. The circuit of claim 1, in which said transmission line has a line length of $l$, said circuit operating in said first frequency band as a $\lambda/2$ resonant circuit with a line length of $l$ when said one of said capacitive means is enabled, and in said second frequency band as a $\lambda/4$ resonant circuit with a line length of $l$ when said one of said capacitive means is disabled.

5. The circuit of claim 1, in which said second capacitive means selectively operatively enabled and disabled comprises a variable capacitance diode having the characteristic of acting as a capacitance when reverse biased and as a short circuit when forward biased, said enabling and disabling means comprising means electrically connected to said diode and effective to establish reverse and forward bias thereto.

6. The circuit of claim 5, in which said transmission line has a line length of $l$, said circuit operating in said first frequency band as a $\lambda/2$ resonant circuit with a line length of $l$ when said one of said capacitive means is enabled, and in said second frequency band as a $\lambda/4$ resonant circuit with a line length of $l$ when said one of said capacitive means is disabled.

7. The circuit of claim 1, in which said first and second capacitive means each comprise variable capacitance diodes having the characteristic of acting as a capacitance when reverse biased and as a short circuit when forward biased, means defining said varying means operatively connected to said first diode for providing reverse biasing thereto, and means operatively connected to said second diode for selectively applying reverse or forward bias thereto, said last mentioned means comprising said enabling and disabling means.

8. The circuit of claim 7, in which said biasing means comprise means for applying a potential signal to said line, and means for applying selected voltages to said diodes.

9. The circuit of claim 8, in which said inductance line has a line length of $l$, said circuit operating in said first frequency band as a $\lambda/2$ resonant circuit with a line length of $l$ when said second variable capacitance diode is reverse biased, and in said second frequency band as a $\lambda/4$ resonant circuit with a line length of $l$ when said second variable capacitance diode is forward biased.

10. The circuit of claim 7, in which said inductance line has a line length of $l$, said circuit operating in said first frequency band as a $\lambda/2$ resonant circuit with a line length of $l$ when said second variable capacitance diode is reverse biased, and in said second frequency band as a $\lambda/4$ resonant circuit with a line length of $l$ when said second variable capacitance diode is forward biased.

References Cited

UNITED STATES PATENTS

| | | | |
|---|---|---|---|
| 2,774,045 | 12/1956 | Wilcox | 334—44 X |
| 2,795,699 | 6/1957 | Balash et al. | |
| 3,140,444 | 7/1964 | Carlson | 334—44 X |
| 3,179,892 | 4/1965 | Chasek | 325—445 X |
| 3,289,123 | 11/1966 | Bomhardt et al. | 334—45 X |
| 3,353,126 | 11/1967 | Schucht | 334—15 X |
| 3,391,347 | 7/1968 | Bosse et al. | 334—15 X |
| 3,416,099 | 12/1968 | Vane | 331—101 X |

HERMAN K. SAALBACH, Primary Examiner

W. H. PUNTER, Assistant Examiner

U.S. Cl. X.R.

333—82; 334—45